United States Patent [19]
Hao et al.

[11] Patent Number: 5,991,698
[45] Date of Patent: Nov. 23, 1999

[54] ELECTRICAL LAP GUIDE DATA ACQUISITION UNIT AND MEASUREMENT SCHEME

[75] Inventors: Shanlin Hao; Ray V. Rigles, both of Eden Prairie; William P. Wood, Edina; Lars H. Ahlen, Eagan; John C. Heitke, Burnsville, all of Minn.

[73] Assignee: Seagate Technology, Inc., Scotts Valley, Calif.

[21] Appl. No.: 08/852,434

[22] Filed: May 7, 1997

Related U.S. Application Data

[60] Provisional application No. 60/036,567, Jan. 29, 1997.

[51] Int. Cl.⁶ ..................................................... G06F 19/00
[52] U.S. Cl. ................................ 702/65; 702/64; 702/57; 702/116; 702/118; 451/1; 451/5; 451/8; 29/603.1; 29/593; 29/603.09
[58] Field of Search .................................. 702/65, 64, 57, 702/58, 59, 190, 116–118, 183–185; 364/468.28, 474.01, 724.11; 360/113, 122, 126; 451/5, 1, 8; 29/593, 603.01, 603.09, 603.1, 603.14, 0.16, 407.01, 705, 707; 324/252, 549, 691, 719, 722

[56] References Cited

U.S. PATENT DOCUMENTS

| | | | |
|---|---|---|---|
| 4,457,114 | 7/1984 | Hennenfent et al. | 51/216 R |
| 4,477,968 | 10/1984 | Kracke et al. | 29/603 |
| 4,536,992 | 8/1985 | Hennenfent et al. | 51/109 R |
| 4,559,743 | 12/1985 | Kracke et al. | 51/165 R |
| 4,689,877 | 9/1987 | Church | 29/603 |
| 4,912,883 | 4/1990 | Chang et al. | 451/1 |
| 4,914,868 | 4/1990 | Church et al. | 51/165.71 |
| 5,023,991 | 6/1991 | Smith | 29/603 |
| 5,361,547 | 11/1994 | Church et al. | 451/5 |
| 5,722,155 | 3/1998 | Stover et al. | 29/603.1 |
| 5,755,612 | 5/1998 | Schaenzer et al. | 451/5 |

*Primary Examiner*—Hal Wachsman
*Attorney, Agent, or Firm*—Westman, Champlin & Kelly, P.A.

[57] ABSTRACT

A lapping system data acquisition unit is disclosed for use in measuring resistances of multiple resistors embedded in a structure to be machined. Each of multiple independent current sources directs a current through one of the multiple resistors embedded in the structure during machining of a surface of the structure. Each of multiple voltage sensing devices couples to a separate one of the multiple resistors and provides a separate analog voltage output signal indicative of the resistance of the resistor. Each of multiple filters is coupled to a separate one of the multiple voltage sensing devices Analog-to-digital conversion circuitry coupled to the multiple filters generates a digitized signal for each of the filtered output signals.

20 Claims, 6 Drawing Sheets

ELECTRICAL LAP GUIDE DATA ACQUISITION UNIT AND MEASUREMENT SCHEME

The present application claims the benefit of earlier filed U.S. Provisional Application Ser. No. 60/036,567, entitled "ELG MEASUREMENT SCHEME", filed on Jan. 29, 1997.

BACKGROUND OF THE INVENTION

The present invention relates generally to the batch fabrication of sliders which carry magnetoresistive (MR) and/or inductive transducers for data storage applications. More particularly, the present invention relates to the measurement of electrical lap guide (ELG) resistors which guide the lapping process such that the head sliders in a row or bar are machined to a specified transducer height.

Magnetic read/write transducers are produced using thin film deposition techniques. In a typical process, an array of transducers are formed on a common substrate. The substrate is sliced to produce bars, with one row of transducers in a side-by-side pattern on each bar. The bars are then machined or lapped to establish a desired MR transducer height (sometimes referred to as a stripe height SH) or a desired inductive transducer height (sometimes referred to as a throat height TH). After the air bearing surface pattern is formed on the bars, the bars are diced to produce individual head sliders which contain the magnetic transducers.

In order to establish adequate performance for high efficiency recording heads, it is desired to achieve the specified transducer height with very tight tolerance. ELGs for this and other purposes are well known in the art. See for example, U.S. Pat. No. 5,023,991 entitled ELECTRICAL GUIDE FOR TIGHT TOLERANCE MACHINING, which issued to Alan Smith on Jun. 18, 1991. One common practice is to use ELGs and a feedback controlled bending mechanism to form a closed-loop lapping process. ELG measurement accuracy, noise and resolution directly affect finished slider SH and TH variation. As the data storage industry is continuously driven by higher density and lower cost requirements, the transducer height tolerance continues to decrease, while the number of head sliders per bar increases, leading to thinner and more flexible bars. To maintain and improve transducer height control during the lapping process, more accurate ELG measurement and monitoring techniques are required.

ELG's typically include three resistive components, but can contain a greater or lesser number if desired. Frequently, as many as 14 ELGs are included per bar. Therefore, a great number of resistances must be measured during lapping. Conventionally, data acquisition units (DAUs) for measuring the resistances of the large number of ELG components on a bar have included a single current source, a multiplexer, and a signal processing channel. To measure the resistance of an individual ELG resistive component, the single current source is directed by the multiplexer to excite the component. The corresponding voltage signal is connected to the signal processing channel by the multiplexer and is amplified, filtered and digitized The digitized resistance reading is then stored in the memory of the control computer. This procedure is repeated through time multiplexing, with the single current source exciting one resistive element at time, through switching or multiplexing, to read all of the ELG resistive elements.

These conventional DAU measurement systems and techniques introduce a number of problems. First, ELG resistance readings using conventional DAUs are not independent of other ELG resistance readings. To make the measurements at a desired sampling rate, the current source, voltmeter and filter have to be switched from resistive element to resistive element through multiplexing. Since the current source and the filters need time to settle after switching from one ELG measurement to the next, significant quantities of noise are introduced into the measurement signal if too many resistive elements are monitored, thus limiting the time available. Other sources of noise which effect the measurement accuracy are caused by the mechanical bending portions of the system. These and other disadvantages of prior art lapping systems are eliminated or reduced by the present invention.

SUMMARY OF THE INVENTION

A lapping system data acquisition unit of the present invention that is disclosed for use in measuring resistances of multiple resistors embedded in a structure to be machined. Each of multiple independent current sources directs a current through one of the multiple resistors embedded in the structure during machining of a surface of the structure. Each of multiple voltage sensing devices couples to a separate one of the multiple resistors and provides a separate analog voltage output signal indicative of the resistance of the resistor. Each of multiple filters is coupled to a separate one of the multiple voltage sensing devices. Analog-to-digital conversion circuitry coupled to the multiple filters generates a digitized signal for each of the filtered output signals.

DETAILED DESCRIPTION OF THE PREFERRED EMBODIMENTS

The present invention includes DAUs which are particularly adapted for monitoring resistances of ELG elements on a bar of head sliders being machined to achieve a desired transducer height. However, the DAUs and measurement schemes of the present invention can be employed to monitor the resistances of multiple ELG resistors used to control any of a wide variety of machining processes.

Figure 1:
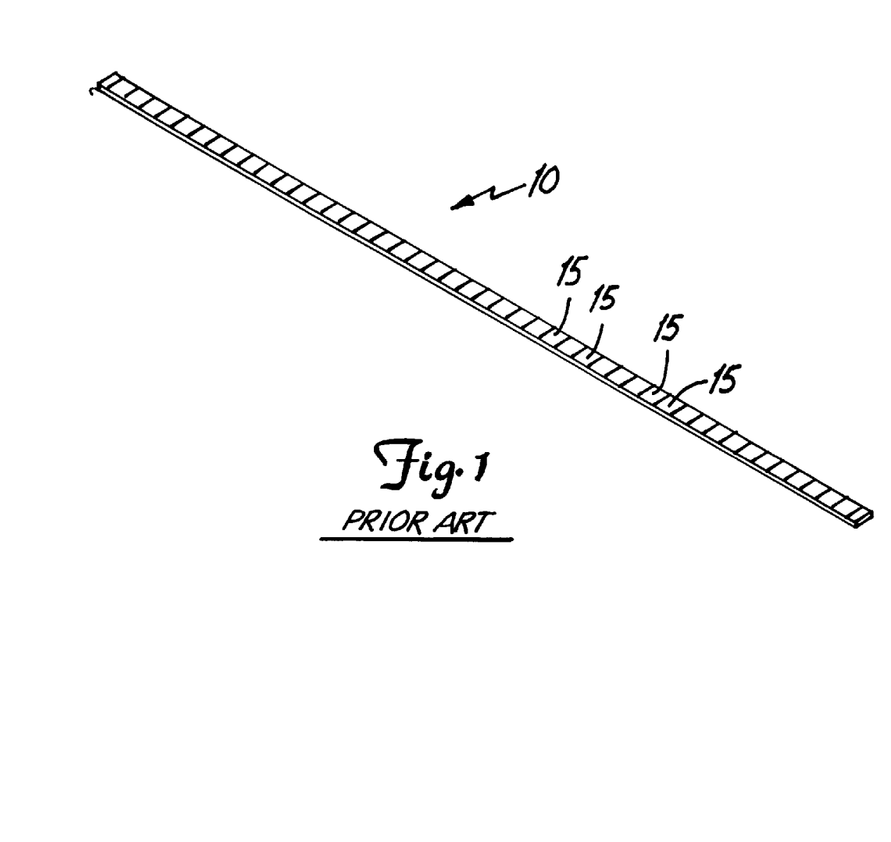
FIG. 1 is a perspective view of a row or bar of head sliders which can be lapped to obtain a desired transducer height using the system of the present invention.

FIG. 1 is a perspective view illustrating bar 10 which contains an array of head sliders 15. As is known in the art, bar 10 is typically mounted on a lapping system work piece (not shown) for lapping to achieve a desired transducer height. A lapping system DAU is coupled to the resistive elements of ELG's located within bar 10 to control the lapping process.

Figure 2:
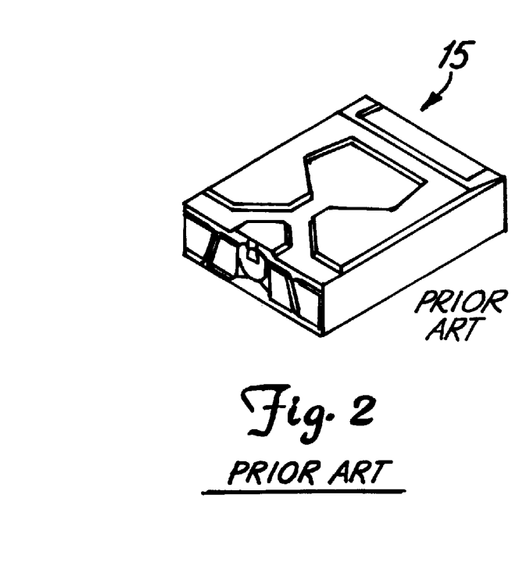
FIG. 2 is perspective view of a completed head slider obtained by dicing the bar of head sliders illustrated in FIG. 1.

Industry requirements necessitate an increase in the number of head sliders 15 located on each bar 10 and improved control of the lapping process. After lapping the bar to achieve the desired transducer height, the air bearing surface design is formed on head sliders 15. Subsequently, bar 10 is diced to separate the individual head sliders 15, one of which is shown in FIG. 2.

Figure 3:
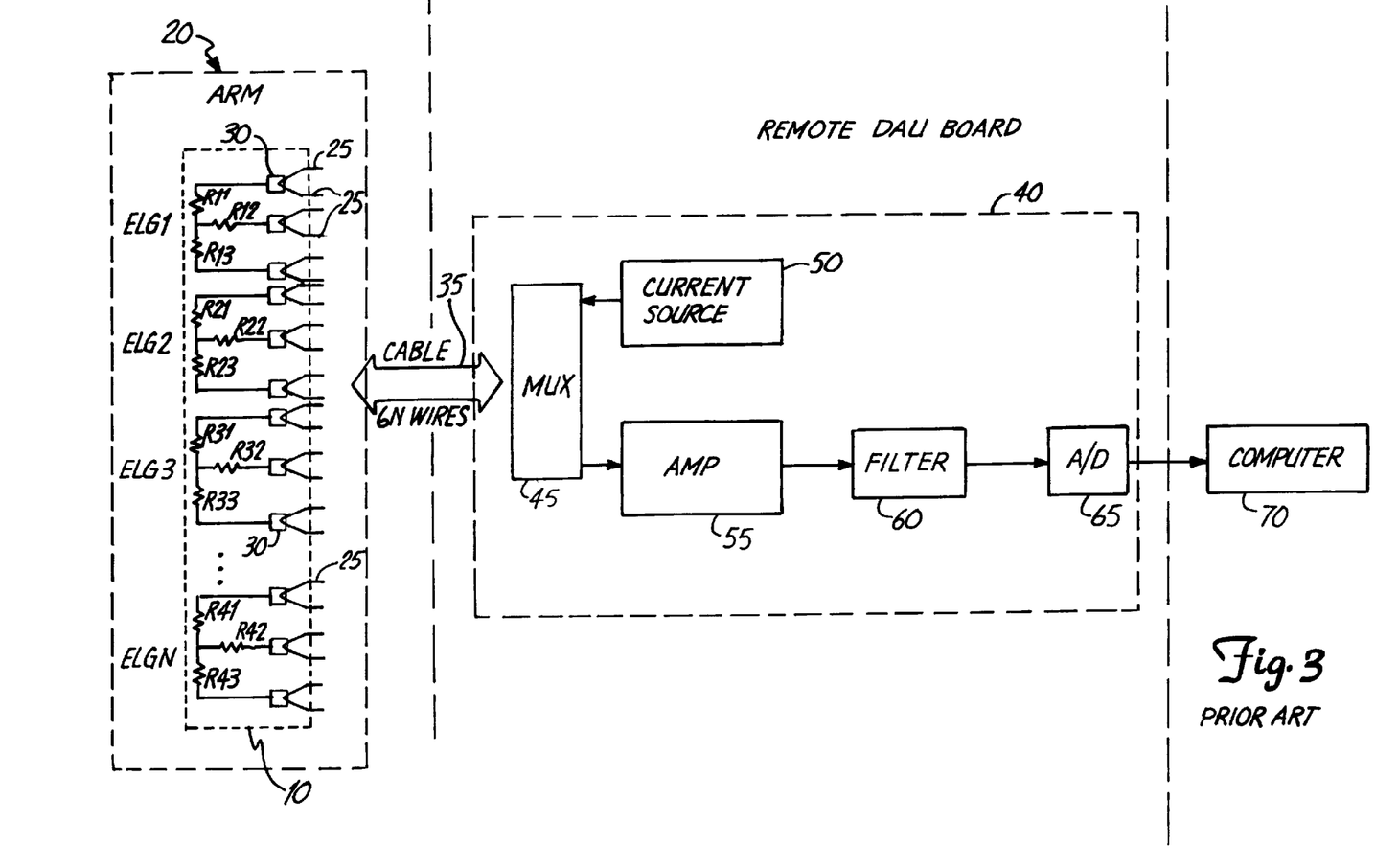
FIG. 3 is a view of a prior art lapping system DAU which is conventionally used to monitor/control the lapping process.

FIG. 3 is a diagrammatic illustration of a conventional DAU and measurement scheme of the type typically used in lapping systems to control machining of bar 10 of head sliders. Bar 10 is mounted on a carrier on arm 20 of a lapping machine during lapping. As discussed above, bar 10 contains multiple ELGs (ELG1 through ELGN) for use in controlling the lapping process to achieve a desired transducer height. As illustrated in FIG. 3, each of the ELG's in this example include three resistors. Resistor $R_{N1}$ (where N designates which of the N ELGs is being referred to) of each ELG is typically an analog resistor which is exposed to the machined surface during lapping such that its resistance is changed by the machining process. Reference resistors $R_{N2}$ and $R_{N3}$ can be monitored and used to calculate local sheet resistance Q, prior to lapping, which can then be combined with the measured resistance of resistor $R_{N1}$ to estimate the transducer height.

Monitoring reference resistor $R_{N3}$ during lapping allows compensation for resistance measurement variations caused by thermal effects or other sources. It is generally not necessary to continuously monitor reference resistors $R_{N2}$ during lapping. Therefore, after measuring reference resistors $R_{N2}$ prior to lapping in order to calculate local sheet resistance Q, these reference resistors need only be monitored occasionally, if at all. It must be noted that ELGs and measurement schemes having more or less than three resistors can be used. The reference resistors of each ELG are accessed via bond pads or terminals 30 on a surface of bar 10. Using conventional measurement techniques, two leads 25 are required for each ELG resistive element. Thus, a total of 6N leads are required and are connectable through 6N wires in cable 35 to DAU 40.

As illustrated in FIG. 3, DAU 40 and the corresponding measurement scheme typically used in the prior art include single current source 50, multiplexer 45, amplifier 55, filter 60 and analog-to-digital (A/D) converter 65. To measure the resistance of one of the resistive elements of one of the ELGS, current from current source 50 is directed by multiplexer 45 to excite the particular ELG resistor. The resulting voltage signal is connected through cable 35 and multiplexer 45 to amplifier 55, filter 60 and A/D converter 65. The digitized resistance representative voltage reading is then stored in the memory of remote computer 70. This procedure is repeated in a time multiplexed fashion to monitor the resistances of all desired ELG elements during lapping. As a result, this conventional DAU format and measurement scheme introduces a number of problems.

First, this scheme results in significant coupling/cross-talk of resistance measurement signals. ELG resistance readings using this scheme are not independent. To make the measurement at a desired sampling rate, current source 50 has to be switched from channel to channel to the desired ELG resistive elements through multiplexing. However, low pass filter 60, with a corresponding cut-off frequency, requires a certain amount of settling time. Without sufficient settling time, cross-talk affects the signals provided to A/D converter 65.

A second problem with the conventional scheme illustrated in FIG. 3 relates to process noise. Lapping is a relatively slow process. However, there is typically mechanical motion or other process related higher frequency noise in the system. To accurately measure ELG resistances, it is desired to filter out high frequency noise in the measurement signals. The scheme illustrated in FIG. 3 is not able to meet this requirement because sampling occurs when the current source is switched from one channel to the next. The result is that some mechanical process noise components remain in the measurement signals and ultimately effect the lapping accuracy.

A third problem relates to aliasing. Sampling theorem requires that the sampling rate ($\omega$) be greater than twice the signal bandwidth. Otherwise, any frequency components in the signal above $\omega/2$ are "folded" about this frequency due to overlap of the shifted versions of the signal spectrum. Thus, the signal cannot be completely recovered from its sample. For the scheme shown in FIG. 3, sampling actually happens when the current source and voltmeter (amplifier 55) are switched to read $R_{N1}$, $R_{N2}$ and $R_{N3}$ in different ELG's. Anti-aliasing filtering cannot be implemented. As a result, noise in ELG signals may exist due to aliasing.

A fourth problem with the scheme illustrated in FIG. 3 relates to a resulting low signal-to-noise ratio (SNR). The electronics configuration normally requires a long cable 35 to connect all of the ELG leads 25 on arm 20 to DAU 40 in the remote control box. This tends to introduce more noise to already typically low ELG signal amplitudes. A fifth problem relates the limited number of channels available. Current DAU's normally monitor as many as fourteen ELG's. As bars are getting thinner and the number of sliders per bar higher, slider transducer height profiles across the bar can vary significantly. To maintain and improve transducer height control, more channels are needed in the ELG DAU. This increases the number of wires needed in cable 35.

Figure 4:
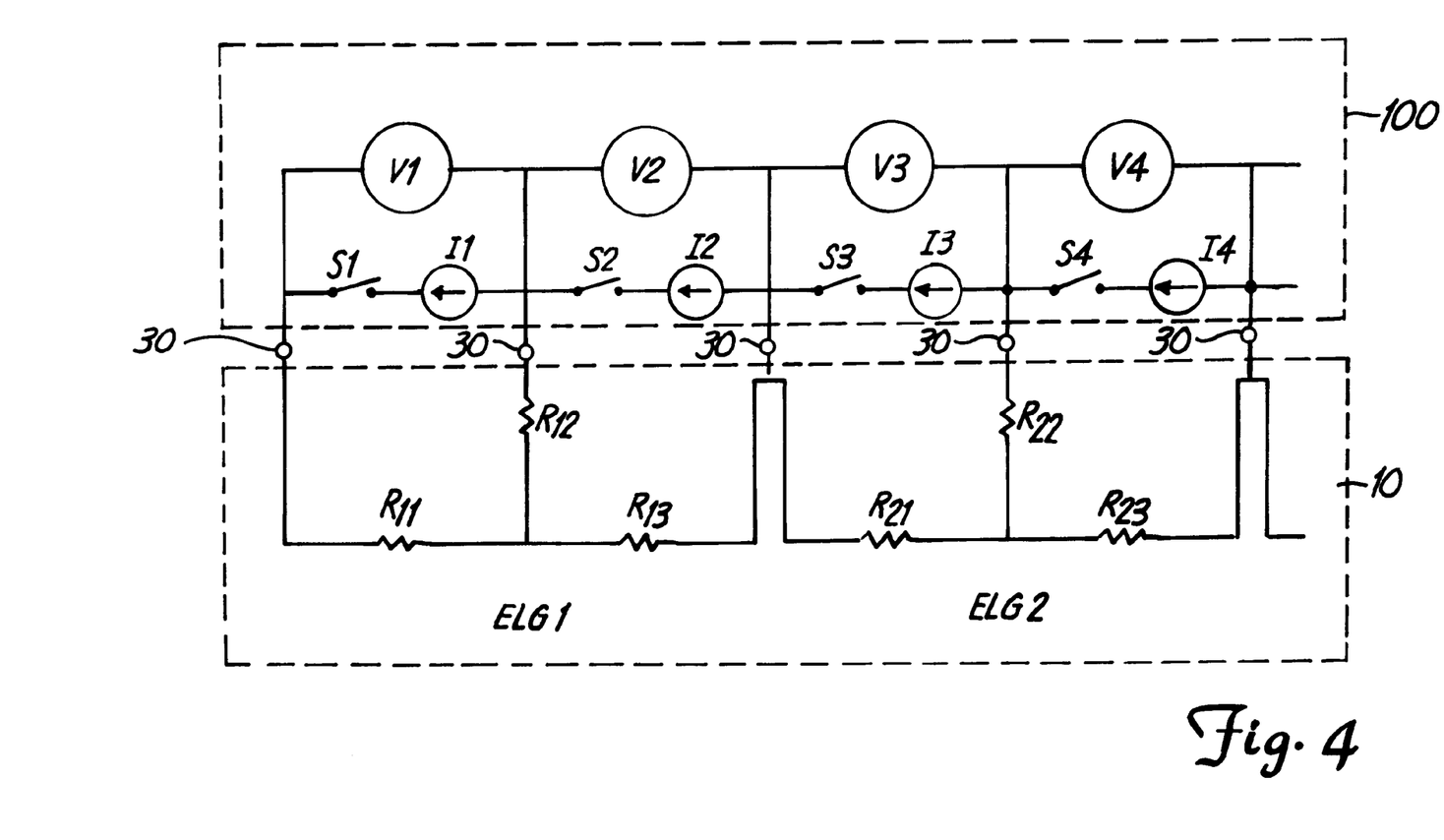
FIG. 4 is a schematic illustration of a portion of an improved lapping system DAU in accordance with preferred embodiments of the present invention.

FIG. 4 is a schematic illustration of an improved ELG measurement scheme which is implemented using DAU 100 of the present invention. Illustrated in FIG. 4 are 2 ELGs, ELG1 and ELG2, out of the N ELGs on bar 10. While only two ELGs are illustrated, the concepts are readily implemented with all N ELGs.

According to the measurement scheme implemented by DAU 100 of the present invention, an independent current source and signal processing channel (i.e. voltmeters or amplifiers, and filters) are included for each individual ELG resistor element to be measured relatively continuously throughout the lapping process. Using for example the three resistor ELG configuration illustrated in FIG. 4, switches S1, S2, S3 and S4 are controlled in order to substantially constantly excite ELG resistive elements $R_{11}1$, $R_{13}$, $R_{21}$ and $R_{23}$. Voltmeters V1, V2, V3 and V4 are then used to measure, on a substantially constant basis, the voltage drops across resistors $R_{11}$, $R_{13}$, $R_{21}$ and $R_{31}$, respectively.

Resistances of resistive elements $R_{12}$ and $R_{22}$ are preferably measured at a low sampling rate to minimize switching effects. For example, reference resistors $R_{12}$ and $R_{22}$, which are not exposed to machining and which are not supposed to change in value, can be measured once immediately after lapping begins by closing switches S1 and S3 and measuring the voltages with voltmeters V2 and V4. The resistance of reference resistor $R_{12}$ is equal to voltage V2 divided by current I1. The resistance of reference resistor $R_{22}$ is equal to voltage V4 divided by current I3.

Switches S2 and S4 are then closed and voltages V1, V2, V3 and V4 are sampled at the desired rate throughout the lapping process to measure resistors $R_{11}$, $R_{13}$, $R_{21}$, $R_{23}$. The resistance of resistor $R_{11}$ can be determined using the relationship $R_{11}=(V1/I1)-R_{12}*(1-I2/I1)$. The resistance of resistor $R_{13}$ can be determined using the relationship $R_{13}=(V2/I2)-R_{12}*(1-I1/I2)$. The resistance of resistor $R_{21}$ can be determined using the relationship $R_{21}=(V3/I3)-R_{22}*(1-I4/I3)$. Finally, the resistance of resistor $R_{23}$ can be determined using the relationship $R_{23}=(V4/I4)-R_{22}*(1-I3/I4)$. Of course, resistances $R_{N1}$ and $R_{N3}$ for other ELGs can be determined in a similar manner using additional current sources, voltmeters and switches. The resistances of resistors $R_{N2}$ can be sampled at a much slower rate during lapping to compensate for process related resistance variations such as thermal effects.

Precision four wire resistance measurement techniques are used in the scheme. As shown in FIG. 4 voltages are measured directly across the resistors driven by the independent precision current sources. Thus errors from switches S1, S2, S3 and S4 and lead resistances are minimized. By assigning multiple current sources in order to continuously excite the resistors, errors due to current source switching are largely eliminated. During lapping, resistors $R_{N1}$ are exposed to the surface of a lap plate which can be conductive, through a hydrodynamic layer formed by the presence of a slurry compound and diamond particles. To minimize the current leakage through the plate, the independent current sources (i.e., I1, I2, I3 and I4) are preferred in the DAU and measurement scheme of the present invention to be isolated current sources.

Measurement accuracy is dependent upon current source calibration and stability (<10 ppm), current leakage to the voltmeters (<1 nA), and current leakage to switches (<1 nA). Each voltmeter represents an instrumentation amplifier with high impedance (>10$_{10}$ ohms), high channel isolation (>100 dB) and a differential input.

Figure 5:
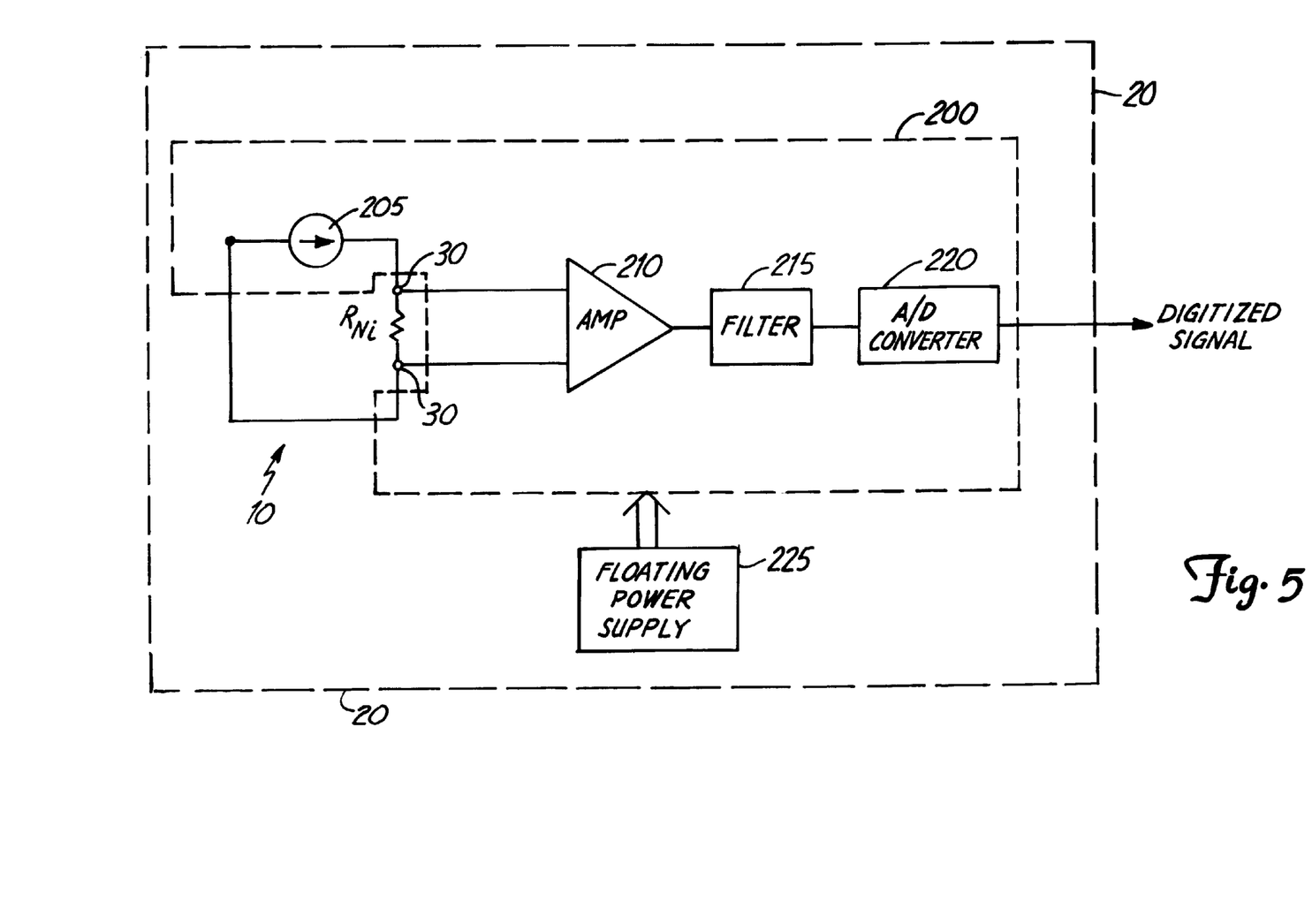
FIG. 5 is a diagrammatic illustration of a portion of the lapping system DAU illustrated in FIG. 4.
Figure 6:
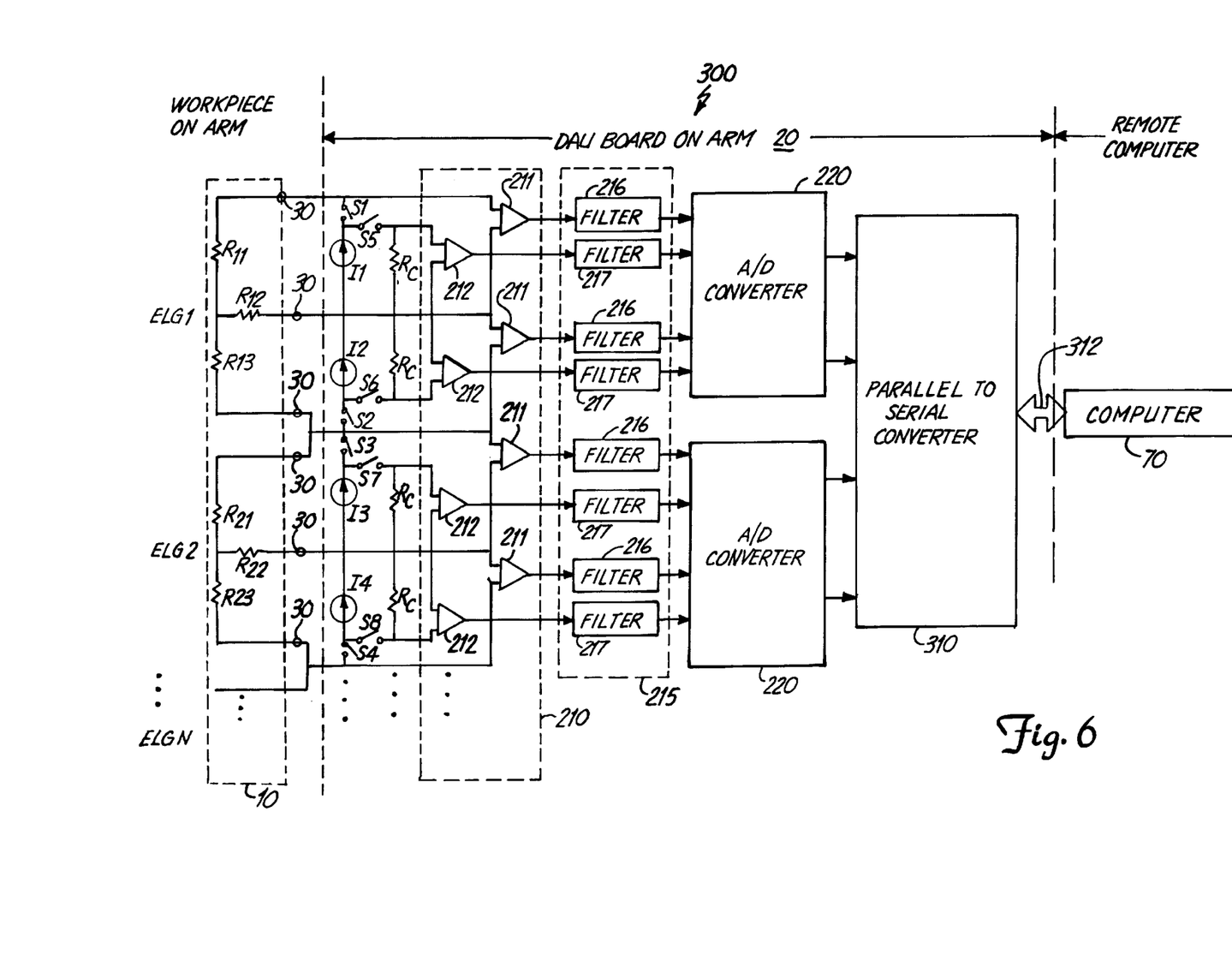
FIG. 6 is a diagrammatic illustration of one embodiment of the lapping system DAU of the present invention.

Diagrammatic illustrations of preferred embodiments of DAUs based upon the present invention are also shown in FIGS. 5 and 6. FIG. 5 is a diagrammatic illustration of a portion of DAU 200 in accordance with the present invention. FIG. 5 illustrates only one resistive element out of the multiple resistive elements of the N ELGs on bar 10. Therefore, FIG. 5 also only illustrates the DAU channel having single current source 205, voltmeter or amplifier 210, filter 215 and A/D converter 220. However, it is clear that DAU 200 will have multiple independent current sources, voltmeters, filters and A/D converters to measure the resistances of the multiple resistive element on bar 10. Additionally, FIG. 5 illustrates DAU 200 positioned on arm 20 which is also where the carrier on which bar 10 is mounted is located. This is a departure from conventional DAUs like the one illustrated in FIG. 3 in which the DAU is located remotely from arm 20, thus requiring that the cable connecting the DAU to bar 10 include many wires for coupling the analog signals from the various ELG elements to the multiplexer.

In FIG. 5, ELG resistive elements $R_{Ni}$ (where N represents the ELG number, and where i represents which of the resistors of the particular ELG is being monitored) has independent current source 205 of DAU 200 coupled in series such that current from current source 205 excites resistive element $R_{Ni}$ substantially continuously during the lapping process. Dedicated amplifier 210 has inputs which are connected across resistor $R_{Ni}$ and provides as an output a resistance dependent voltage signal. Filter 215 filters the signal before providing it to A/D converter 220. As discussed previously, because the signal provided to filter 215 is not a sampled signal indicative of resistances of many ELG resistors, the cutoff frequencies of filter 215 can be chosen to optimize the reduction of noise in the signal. This is also a departure from the prior art where the sampling rate dictates the filter characteristics.

A/D converter 220 provides as an output a digitized signal representative of the resistance of resistor $R_{Ni}$. This is also a departure from conventional DAUs in that the resistance signals are digitized on arm 20, as opposed to at a remote location. Finally, DAU 200 includes floating (non-grounded) power supply 225 in order to minimize current leakage and the introduction of ground noise. Typically, floating power supply 225 will be an isolated DC-to-DC converter.

FIG. 6 is a schematic illustration of DAU 300 in accordance with preferred embodiments of the present invention. DAU 300 is substantially the same or similar to DAU 200, but illustrates the independent current sources, amplifiers and filters used to monitor multiple ELG resistive elements. Also, DAU 300 both illustrates individual features of DAU 200 in greater detail, and includes parallel to serial converter 310. DAU 300 is mounted on arm 20 and the ELG readings are digitized on the arm to eliminate the noise and errors that would be introduced by cabling to a remote DAU. DAU 300 also includes calibration features not shown in DAUs 100 and 200.

As illustrated in FIG. 6, bar 10 includes N three resistor ELGs for use in monitoring and controlling lapping of bar 10 to achieve a desired transducer height. The resistive elements of the ELGs on bar 10 are accessed through bond pads 30 on the surface of bar 10. As was the case with DAU 100 illustrated in FIG. 4, with DAU 300 connected to the ELGs on bar 10 through bond pads 30, current source I1 is normally connected in series with resistor $R_{11}$ when switch S1 is closed. Likewise, with switches S2, S3 and S4 closed, current sources I2, I3 and I4 are usually connected in series with respective one of resistors $R_{13}$, $R_{21}$ and $R_{23}$. In this and other respects, DAU 300 functions the same as DAU 100 discussed above with reference to FIG. 4. Also as discussed above with reference to FIG. 4, switches S1, S2, S3 and S4 are controllable to measure the resistances of resistors $R_{12}$ and $R_{22}$.

During normal operations, DAU 300 functions substantially as described above with reference to FIGS. 4 and 5. DAU 300 includes amplifiers 210, filters 215, A/D convertors 220 and parallel to serial convertor 310. Amplifiers 210 are preferably a series of individual amplifiers 211 and 212 each operating in a differential amplifier configuration. Amplifiers 211 are used to measure resistances of ELG resistors $R_{Ni}$ as previously discussed. Amplifiers 212 are used to measure the resistances of calibration resistors $R_C$. Filters 215 include a series of filters 216 and 217. Filters 216 are coupled to the outputs of amplifiers 211, while filters 217 are coupled to the output of amplifiers 212. Filters 215 are preferably low pass filters, which perform an anti-aliasing function. The cutoff frequencies of filters 215 can be chosen based upon the band width of the signals being filtered, as opposed to being chosen based upon the sampling rate as was the case in the prior art.

A/D converters 220 are preferably four channel A/D converters (typically Delta-Sigma A/D devices), having greater than 16 bit resolution, programmable gain, internal digital filtering and self-calibration. However, other D/A conversion circuitry can be used. Parallel to serial converter 310 receives the digitized measurement signal from A/D convertors 220 and converts multiple digitized signals into a signal serial bit stream for communication through cable 312 to a remotely positioned computer or controller 70.

Each ELG signal acquisition channel includes an analog interface and a four channel A/D converter 220. The analog interface includes two isolated current sources (for example current sources I1 and I2), two calibration resistors $R_C$, four switches (for example, switches S1, S2, S5 and S6) and four subchannels (i.e. two combinations of amplifiers 211 and filters 216, and two combinations of amplifiers 212 and filters 217) for amplifying and filtering measured analog signals.

DAU 300 differs from DAUs 100 and 200 in that it includes calibration resistors $R_C$, as well as amplifiers 212 and filters 217 for amplifying and filtering the calibration measurement signal. As an example of the manner in which DAU 300 is calibrated, for the DAU channel corresponding to ELG 1, switches S1 and S2 are opened while switches S5 and S6 are closed. This provides currents I1 and I2 to calibration resistors $R_C$. The voltage drops across these calibration resistors are amplified by amplifiers 212 and filtered by filters 217. Next, the calibration resistance measurement signals are converted to digital signals by A/D converters 220, serialized by converter 310 and provided for calibration to computer 70. When not in calibration mode, the resistances or resistors $R_{N1}$, $R_{N2}$, $R_{N3}$ are determined by controlling the corresponding switches in the same manner as described above with reference to DAU 100 shown in FIG. 4.

Figure 7:
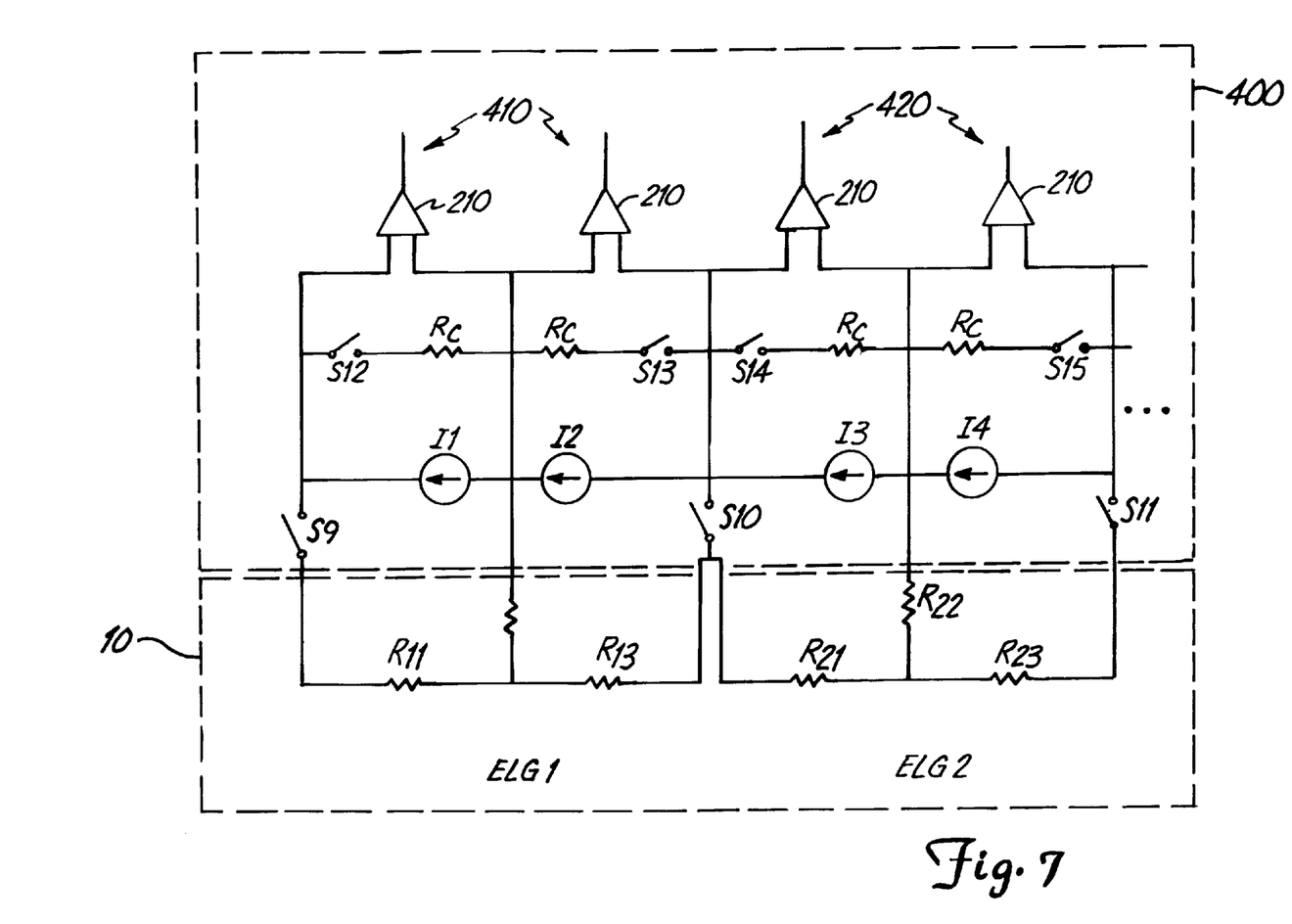
FIG. 7 is a diagrammatic illustration of a portion of an alternate embodiment of the lapping system DAU of the present invention.

FIG. 7 illustrates an alternative DAU based upon the proposed invention, but which reduces the number of amplifiers, filters and A/D converters required. However, using this embodiment, switch-on effects are included in the resistance measurements. DAU 400 is illustrated diagrammatically in the format of FIG. 4. However, DAU 400 will be implemented like, and share most of the features with, DAU 300 illustrated in FIG. 6.

FIG. 7 illustrates two channels of DAU 400, channel 410 for measuring resistances of ELG1 and channel 420 for measuring resistances of ELG2. DAU 400 cuts the number or amplifiers 210, as well as the number filters and A/D converters (not shown), in half by controlling switches S9, S10, S11, S12, S13, S14 and S15 to provide the desired measurement signals to amplifiers 210. In this way, instead of having a separate amplifier and filter for the calibration resistors, calibration and lapping resistor measurements use the same channels.

The DAUs of the present invention provides numerous advantages over the prior art. By including dedicated current sources and voltage sensing circuitry for measuring the resistances of ELG resistors on a substantially constant basis, the switching effects experienced in the prior art are minimized or eliminated. Further, by positioning the DAUs of the present invention on the arm which supports the machined object, digitized signals can be transmitted to the remote computer controlling the process. This greatly improves the signal-to-noise ratio and therefore minimizes errors. Further, by including a parallel to serial converter, far less electrical connections are needed in the cabling between the DAU and the remote computer, as compared to the number of wires required in the cabling between prior art DAUs and the ELGs on the structure being machined. Further, since switching between channels is greatly reduced, the filters of the DAUs of the present invention can be selected for their ability to reduce noise. This was frequently not the case in conventional DAU designs.

Although the present invention has been described with reference to preferred embodiments, workers skilled in the art will recognize that changes may be made in form and detail without departing from the spirit and scope of the invention.

What is claimed is:

1. A data acquisition unit for use in measuring resistances of a first plurality of resistors embedded in a structure to be machined, the data acquisition unit comprising:
   a first plurality of independent current sources, wherein each of the first plurality of independent current sources directs a current through one of the first plurality of resistors embedded in the structure during machining of a surface of the structure;
   a first plurality of voltage sensing devices, wherein each of the first plurality of voltage sensing devices couples to a separate one of the first plurality of resistors embedded in the structure during machining of the surface of the structure, and wherein each of the first plurality of voltage sensing devices provides a separate analog voltage output signal indicative of the voltage drop across the respective one of the first plurality of resistors;
   a first plurality of filters, wherein each of the first plurality of filters is coupled to a separate one of the first plurality of voltage sensing devices for filtering the corresponding separate analog voltage output signal and providing a filtered output signal; and
   analog-to-digital conversion circuitry coupled to the first plurality of filters, wherein the analog-to-digital conversion circuitry generates a digitized signal for each of the filtered output signals, the digitized signal for each of the filtered output signals being indicative of the voltage drop across the respective one of the first plurality of resistors and of the resistance of the respective one of the first plurality of resistors.

2. The data acquisition unit of claim 1, wherein each of the first plurality of independent current sources directs current through the corresponding one of the first plurality of resistors substantially continuously during machining of the surface of the structure.

3. The data acquisition unit of claim 1, and further comprising a first plurality of floating ground power supplies, wherein a separate one of the first plurality of floating ground power supplies is coupled to each of the first plurality of independent current sources and provides power to the corresponding one of the first plurality of independent current sources to which it is coupled.

4. The data acquisition unit of claim 1, wherein the first plurality of independent current sources, the first plurality of voltages sensing devices, the first plurality of filters and the analog-to-digital conversion circuitry are located on an arm which supports the structure to be machined.

5. The data acquisition unit of claim 4, wherein the plurality of digitized signals are provided to a controller for use in controlling machining of the surface of the structure, wherein the controller is located remotely from the arm.

6. The data acquisition unit of claim 5, and further comprising parallel to serial conversion circuitry located on the arm which supports the structure to be machined and coupled to the analog-to-digital conversion circuitry, the parallel to serial conversion circuitry receiving the digitized signals and providing as an output to the controller a single digitized signal indicative of multiple individual digitized signals.

7. The data acquisition unit of claim 1, wherein each of the first plurality of filters has an upper cut-off frequency which is less than the Nyquist frequency of the analog-to-digital conversion circuitry.

8. The data acquisition unit of claim 1, and further comprising a plurality of calibration resistors selectively coupleable to the first plurality of independent current sources for calibrating the data acquisition unit.

9. A lapping system for lapping a surface of a bar of head sliders to achieve a desired transducer height, the lapping system comprising:

a support for carrying the bar of head slider during lapping;

a data acquisition unit located on the support, the data acquisition unit measuring resistances of a first plurality of electrical lap guide resistors embedded in the bar of head sliders, the data acquisition unit comprising:

a first plurality of current sources, wherein each of the first plurality of current sources directs a current through one of the first plurality of electrical lap guide resistors embedded in the bar of head sliders during lapping;

a first plurality of voltage sensing devices, wherein each of the first plurality of voltage sensing devices couples to a separate one of the first plurality of electrical lap guide resistors during lapping, and wherein each of the first plurality of voltage sensing devices provides a separate analog voltage output signal indicative of the resistance of the respective one of the first plurality of electrical lap guide resistors;

a first plurality of filters, wherein each of the first plurality of filters is coupled to a separate one of the first plurality of voltage sensing devices for filtering the corresponding separate analog voltage output signal and providing a filtered output signal; and analog-to-digital conversion circuitry coupled to the first plurality of filters, wherein the analog-to-digital conversion circuitry generates a digitized signal for each of the filtered output signals, the digitized signal for each of the filtered output signals being indicative of the voltage drop across the respective one of the first plurality of electrical lap guide resistors and of the resistance of the respective one of the first plurality of electrical lap guide resistors; and a controller located remotely from the support, the controller being coupled to the analog-to-digital conversion circuitry and receiving the digitized signal for each filtered output signal, the controller controlling lapping of the bar of head sliders as a function of the digitized signals.

10. The lapping system of claim 9, wherein the first plurality of current sources direct current through the corresponding ones of the first plurality of electrical lap guide resistors substantially continuously during machining of the surface of the bar of head sliders.

11. The lapping system of claim 9, wherein the data acquisition unit further comprises a first plurality of floating ground power supplies, wherein a separate one of the first plurality of floating ground power supplies is coupled to each of the first plurality of current sources and provides power to the corresponding one of the first plurality of current sources to which it is coupled.

12. The lapping system of claim 9, wherein the data acquisition unit further comprises a parallel to serial converting device coupled to the one analog-to-digital conversion circuitry, the parallel to serial converting device receiving the digitized signals and providing as an output to the controller a single digitized signal indicative of multiple individual digitized signals.

13. The lapping system of claim 9, wherein each of the first plurality of filters has an upper cut-off frequency which is less than the Nyquist frequency of the analog-to-digital conversion circuitry.

14. The lapping system of claim 9, wherein the data acquisition unit further comprises a plurality of calibration resistors selectively coupleable to the first plurality of current sources for calibrating the data acquisition unit.

15. A data acquisition unit for use in measuring resistances of resistors of a number, N, of electrical lap guides ELGs embedded in a structure to be machined, the data acquisition unit comprising:

at least N independent current sources, wherein at least one of the at least N independent current sources is coupled to each of the N ELGs and directs a current through the resistors of the respective ELG during machining of a surface of the structure;

at least N voltage sensing devices, wherein each of the at least N voltage sensing devices couples to a resistor of a separate one of the N ELGs during machining of the surface of the structure, and wherein each of the at least N voltage sensing devices provides a separate analog voltage output signal indicative of the voltage drop across the resistor to which it is coupled;

at least N filters, wherein each of the at least N filters is coupled to a separate one of the at least N voltage sensing devices for filtering the corresponding separate analog voltage output signal and providing a filtered output signal; and analog-to-digital conversion circuitry coupled to the at least N filters, wherein the analog-to-digital conversion circuitry generates a digitized signal for each of the filtered output signals, the digitized signal for each of the filtered output signals being indicative of the voltage drop across the respective resistor and of the resistance of the respective resistor.

16. The data acquisition unit of claim 15, wherein each of the at least N independent current sources directs current through the corresponding resistor substantially continuously during machining of the surface of the structure.

17. The data acquisition unit of claim 16, and further comprising at least N floating ground power supplies, wherein a separate one of the at least N floating ground power supplies is coupled to each of the at least N independent current sources and provides power to the corresponding one of the at least N independent current sources to which it is coupled.

18. The data acquisition unit of claim 17, wherein the at least N independent current sources, the at least N voltages sensing devices, the at least N filters and the analog-to-digital conversion circuitry are located on an arm which supports the structure to be machined.

19. The data acquisition unit of claim 18, wherein the digitized signals are provided to a controller for use in controlling machining of the surface of the structure, wherein the controller is located remotely from the arm.

20. The data acquisition unit of claim 19, and further comprising parallel to serial conversion circuitry located on the arm which supports the structure to be machined and coupled to the analog-to-digital conversion circuitry, the parallel to serial conversion circuitry receiving the digitized signals and providing as an output to the controller a single digitized signal indicative of multiple individual digitized signals.

* * * * *

UNITED STATES PATENT AND TRADEMARK OFFICE
CERTIFICATE OF CORRECTION

PATENT NO. : 5,991,698
DATED : November 23, 1999
INVENTOR(S) : Shanlin Hao et al.

It is certified that error appears in the above-identified patent and that said Letters Patent is hereby corrected as shown below:

```
Col. 9, line 4, delete "slider" and insert
--sliders--.
```

Signed and Sealed this

Twenty-seventh Day of March, 2001

Attest:

NICHOLAS P. GODICI

Attesting Officer        Acting Director of the United States Patent and Trademark Office